(12) United States Patent
Tsumori et al.

(10) Patent No.: US 9,139,933 B2
(45) Date of Patent: Sep. 22, 2015

(54) SEMICONDUCTOR SUBSTRATE MANUFACTURING APPARATUS

(75) Inventors: Toshiro Tsumori, Kanagawa (JP);
Shinichi Mitani, Shizuoka (JP);
Kunihiko Suzuki, Shizuoka (JP)

(73) Assignees: NUFLARE TECHNOLOGY, INC.,
Numazu-Shi, Shizuoka (JP); DENSO CORPORATION, Kariya-Shi, Aichi (JP)

( * ) Notice: Subject to any disclaimer, the term of this patent is extended or adjusted under 35 U.S.C. 154(b) by 695 days.

(21) Appl. No.: 13/187,904

(22) Filed: Jul. 21, 2011

(65) Prior Publication Data

US 2012/0031330 A1 Feb. 9, 2012

(30) Foreign Application Priority Data

Aug. 4, 2010 (JP) .................. 2010-175815
Mar. 18, 2011 (JP) .................. 2011-061150

(51) Int. Cl.
*C23C 16/22* (2006.01)
*C23C 16/32* (2006.01)
(Continued)

(52) U.S. Cl.
CPC .............. *C30B 25/12* (2013.01); *C23C 14/021* (2013.01); *C23C 16/0227* (2013.01); *C23C 16/22* (2013.01); *C23C 16/32* (2013.01); *C23C 16/325* (2013.01); *C23C 16/4405* (2013.01); *C23C 16/46* (2013.01); *C30B 29/36* (2013.01); *C30B 33/12* (2013.01)

(58) Field of Classification Search
CPC ...... C23C 16/325; C23C 16/32; C23C 16/22; C23C 16/46; C23C 14/021; C23C 16/0227; C23C 16/4405

USPC ................ 118/719, 724, 725, 663, 688, 665; 156/345.24, 345.31, 345.32, 345.51, 156/345.52
See application file for complete search history.

(56) References Cited

U.S. PATENT DOCUMENTS 4,636,401 A * 1/1987 Yamazaki et al. ............ 427/572
4,715,921 A * 12/1987 Maher et al. ............. 156/345.32
(Continued)

FOREIGN PATENT DOCUMENTS

JP          9-78267         3/1997
JP          9-199424        7/1997
(Continued)

OTHER PUBLICATIONS

Machine Translation: JP09-078267-.*
(Continued)

*Primary Examiner* — Rudy Zervigon
(74) *Attorney, Agent, or Firm* — Finnegan, Henderson, Farabow, Garrett & Dunner, LLP

(57) ABSTRACT

According to this embodiment, a semiconductor substrate manufacturing apparatus for epitaxial growth in which gases are supplied to a wafer placed on a susceptor and in which a heater is provided on the back surface of the susceptor. As a result of this epitaxial growth, SiC film is deposited onto the susceptor in the film-forming chamber. The susceptor is then moved into a separate chamber and the SiC film deposited on the susceptor during the epitaxial process is removed. After removal of SiC film, regeneration of the SiC film of the susceptor occurs. This semiconductor substrate manufacturing apparatus makes it possible to remove film deposited on a susceptor during epitaxial growth that would otherwise limit manufacturing yield.

12 Claims, 6 Drawing Sheets

(51) Int. Cl.

| | |
|---|---|
| *C23C 16/46* | (2006.01) |
| *C23C 16/52* | (2006.01) |
| *C23F 1/00* | (2006.01) |
| *H01L 21/306* | (2006.01) |
| *C30B 25/12* | (2006.01) |
| *C23C 14/02* | (2006.01) |
| *C23C 16/02* | (2006.01) |
| *C23C 16/44* | (2006.01) |
| *C30B 29/36* | (2006.01) |
| *C30B 33/12* | (2006.01) |

(56) References Cited

U.S. PATENT DOCUMENTS

| | | | | |
|---|---|---|---|---|
| 5,149,375 | A * | 9/1992 | Matsuyama | 118/719 |
| 5,350,480 | A * | 9/1994 | Gray | 156/345.26 |
| 5,417,770 | A * | 5/1995 | Saitoh et al. | 136/258 |
| 5,445,491 | A * | 8/1995 | Nakagawa et al. | 414/805 |
| 5,505,779 | A * | 4/1996 | Mizuno et al. | 118/719 |
| 5,616,208 | A * | 4/1997 | Lee | 156/345.24 |
| 5,772,770 | A * | 6/1998 | Suda et al. | 118/719 |
| 5,785,796 | A * | 7/1998 | Lee | 156/345.24 |
| 5,855,681 | A * | 1/1999 | Maydan et al. | 118/719 |
| 5,911,834 | A * | 6/1999 | Fairbairn et al. | 134/1.3 |
| 5,986,747 | A * | 11/1999 | Moran | 356/72 |
| 6,132,577 | A * | 10/2000 | Smith et al. | 204/298.32 |
| 6,228,773 | B1 * | 5/2001 | Cox | 438/707 |
| 6,273,956 | B1 * | 8/2001 | Cox | 118/719 |
| 6,299,722 | B1 * | 10/2001 | Toda | 156/345.25 |
| 6,372,084 | B2 * | 4/2002 | Hongo et al. | 156/345.1 |
| 6,491,758 | B1 * | 12/2002 | Hasegawa et al. | 118/715 |
| 6,592,817 | B1 * | 7/2003 | Tsai et al. | 422/62 |
| 6,653,212 | B1 * | 11/2003 | Yamanaka et al. | 438/485 |
| 6,813,534 | B2 * | 11/2004 | Sui et al. | 700/121 |
| 6,942,892 | B1 * | 9/2005 | Ishibashi | 427/237 |
| 7,015,154 | B2 * | 3/2006 | Yamazaki et al. | 438/795 |
| 7,018,504 | B1 * | 3/2006 | Raaijmakers et al. | 156/345.31 |
| 7,084,068 | B2 * | 8/2006 | Suguro et al. | 438/708 |
| 7,431,795 | B2 * | 10/2008 | Kumar et al. | 156/345.32 |
| 7,604,708 | B2 * | 10/2009 | Wood et al. | 156/345.35 |
| 7,682,454 | B2 * | 3/2010 | Sneh | 118/719 |
| 8,043,438 | B2 * | 10/2011 | Sakai et al. | 134/22.1 |
| 8,075,730 | B2 * | 12/2011 | Shimura et al. | 156/345.32 |
| 8,225,496 | B2 * | 7/2012 | Bachrach et al. | 29/726 |
| 8,293,014 | B2 * | 10/2012 | Kurokawa | 118/715 |
| 8,440,048 | B2 * | 5/2013 | Aggarwal et al. | 156/345.1 |
| 8,486,194 | B2 * | 7/2013 | Bhang et al. | 118/719 |
| 8,580,076 | B2 * | 11/2013 | Becknell et al. | 156/345.25 |
| 2001/0014268 | A1 | 8/2001 | Bryson et al. | 414/217 |
| 2001/0050059 | A1 * | 12/2001 | Hongo et al. | 118/723 MW |
| 2001/0052392 | A1 * | 12/2001 | Nakamura et al. | 156/345 |
| 2002/0002948 | A1 * | 1/2002 | Hongo et al. | 118/723 R |
| 2002/0020355 | A1 * | 2/2002 | Saeki et al. | 118/719 |
| 2002/0064594 | A1 * | 5/2002 | Nakajima et al. | 427/128 |
| 2002/0100418 | A1 * | 8/2002 | Sandhu et al. | 118/719 |
| 2002/0129900 | A1 * | 9/2002 | Yoshioka et al. | 156/345.31 |
| 2003/0029833 | A1 * | 2/2003 | Johnson | 216/58 |
| 2003/0215963 | A1 | 11/2003 | AmRhein et al. | |
| 2004/0020601 | A1 * | 2/2004 | Zhao et al. | 156/345.32 |
| 2004/0053498 | A1 * | 3/2004 | Kaji et al. | 438/687 |
| 2004/0096586 | A1 * | 5/2004 | Schulberg et al. | 427/372.2 |
| 2004/0134429 | A1 * | 7/2004 | Yamanaka et al. | 118/723 E |
| 2004/0163762 | A1 * | 8/2004 | Iizuka et al. | 156/345.39 |
| 2004/0194888 | A1 * | 10/2004 | Ito | 156/345.31 |
| 2004/0229449 | A1 * | 11/2004 | Biberger et al. | 438/584 |
| 2004/0238123 | A1 * | 12/2004 | Becknell et al. | 156/345.33 |
| 2006/0021702 | A1 * | 2/2006 | Kumar et al. | 156/345.32 |
| 2006/0156979 | A1 * | 7/2006 | Thakur et al. | 118/715 |
| 2006/0162660 | A1 * | 7/2006 | Shimizu | 118/719 |
| 2006/0162861 | A1 * | 7/2006 | O'Meara et al. | 156/345.24 |
| 2006/0189138 | A1 * | 8/2006 | Nishimura et al. | 438/692 |
| 2006/0207630 | A1 * | 9/2006 | Sakai et al. | 134/1.1 |
| 2007/0017445 | A1 * | 1/2007 | Takehara et al. | 118/719 |
| 2008/0216959 | A1 * | 9/2008 | Kobayashi et al. | 156/345.55 |
| 2008/0223298 | A1 * | 9/2008 | Shimizu | 118/663 |
| 2009/0017621 | A1 * | 1/2009 | Sako et al. | 438/674 |
| 2009/0302002 | A1 * | 12/2009 | Collins et al. | 216/67 |
| 2010/0029066 | A1 * | 2/2010 | Miyashita | 438/478 |
| 2010/0055807 | A1 * | 3/2010 | Srivastava et al. | 438/9 |
| 2010/0248458 | A1 * | 9/2010 | Mitani et al. | 438/478 |
| 2011/0114014 | A1 * | 5/2011 | Sakurai et al. | 117/88 |
| 2011/0120650 | A1 * | 5/2011 | Asako et al. | 156/345.27 |
| 2011/0136346 | A1 * | 6/2011 | Geissbuhler et al. | 438/710 |
| 2011/0263098 | A1 * | 10/2011 | Su | 438/478 |
| 2012/0031330 | A1 * | 2/2012 | Tsumori et al. | 118/708 |
| 2013/0192761 | A1 * | 8/2013 | Yudovsky et al. | 156/345.55 |
| 2013/0193108 | A1 * | 8/2013 | Zheng et al. | 216/59 |
| 2013/0196078 | A1 * | 8/2013 | Yudovsky et al. | 427/535 |
| 2013/0247816 | A1 * | 9/2013 | Suzuki et al. | 117/86 |
| 2014/0242808 | A1 * | 8/2014 | Akiyama et al. | 438/763 |
| 2014/0262036 | A1 * | 9/2014 | Reuter et al. | 156/345.31 |

FOREIGN PATENT DOCUMENTS

| | | |
|---|---|---|
| JP | 2002-69648 | 3/2002 |
| JP | 2002-270513 | 9/2002 |
| JP | 2004-75493 | 3/2004 |
| JP | 2004-137556 | 5/2004 |
| JP | 2007-73628 | 3/2007 |
| JP | 2008-108983 | 5/2008 |
| JP | 2008-311542 | 12/2008 |
| JP | 2010-65309 | 3/2010 |

OTHER PUBLICATIONS

Machine Translation: JP2002-270513.*
Machine Translation: JP2004-075493.*
Notification of Reasons for Refusal issued by the Korean Intellectual Property Office on May 18, 2012, for Korean Patent Application No. 10-2011-0047960, and English-language translation thereof.
Miura, Y. et al., "Determination of Etch Rate Behavior of 4H-SiC Using Chlorine Trifluoride Gas," Japanese Journal of Applied Physics, vol. 46, No. 12, pp. 7875-7879, (2007).
Notification of Reason for Rejection issued by the Japanese Patent Office on Sep. 2, 2014, in counterpart Japanese Application No. 2011-061150.

* cited by examiner

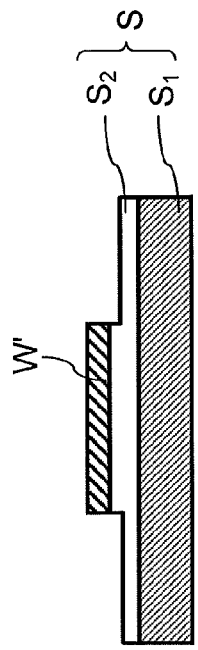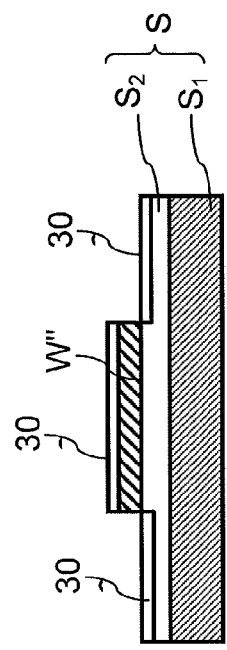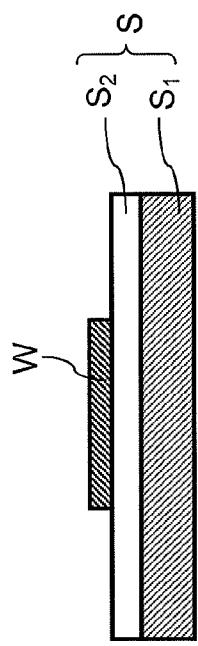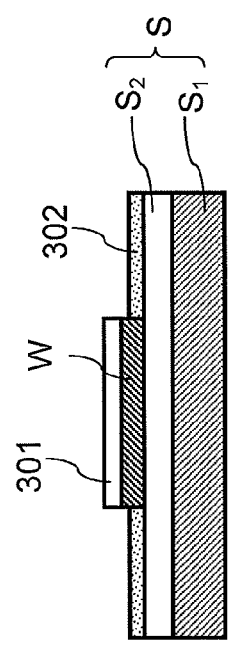

SEMICONDUCTOR SUBSTRATE MANUFACTURING APPARATUS

CROSS-REFERENCE TO THE RELATED APPLICATION

The entire disclosure of the Japanese Patent Application No. 2010-175815, filed on Aug. 4, 2010 and the entire disclosure of the Japanese Patent Application No. 2011-061150, filed on Mar. 18, 2011 including specifications, claims, drawings, and summaries, on which the Convention priority of the present application is based, are incorporated herein in their entirety.

FIELD OF THE INVENTION

The present invention relates to a Semiconductor Substrate Manufacturing Apparatus.

BACKGROUND

Epitaxial growth technique is conventionally used to produce a semiconductor device such as a power device (e.g., IGBT (Insulated Gate Bipolar Transistor)) requiring a relatively-thick crystalline film.

In the case of vapor phase epitaxy used in epitaxial growth technique, a wafer is placed inside a film-forming chamber maintained at atmospheric pressure or a reduced pressure, and a reaction gas is supplied into the film-forming chamber while the wafer is heated. As a result, a pyrolytic reaction or a hydrogen reduction reaction of the reaction gas occurs on the surface of the wafer so that an epitaxial film is formed on the wafer.

In order to produce a thick epitaxial film in high yield, a fresh reaction gas needs to be continuously brought into contact with the surface of a uniformly-heated wafer to increase a film-forming rate. Therefore, in the case of a conventional film-forming apparatus, a film is epitaxially grown on a wafer while the wafer is rotated at a high speed (see, for example, Japanese Patent Application Laid-Open No. 2008-108983).

In recent years, attention has been given to SiC (silicon carbide) epitaxial growth technique. SiC is characterized in that its energy gap is two or three times larger and its dielectric breakdown field is about one digit larger than that of a conventional semiconductor material such as Si (silicon) or GaAs (gallium arsenide). For this reason, SiC is a semiconductor material expected to be used in high-voltage power semiconductor devices.

In order to obtain a single-crystalline SiC thin film by epitaxial growth of such SiC, the temperature of a substrate needs to be increased to 1500° C. or higher. Therefore, a susceptor on which a wafer is to be placed is made of high heat-resistance material. A specific example of such a susceptor includes one obtained by coating the surface of a base material made of graphite with SiC by CVD (Chemical Vapor Deposition) (see, for example, Japanese Patent Application Laid Open No. 2004-75493).

Meanwhile, when epitaxial growth of SiC film is performed in a film-forming chamber, a SiC film is deposited not only on the surface of a wafer but also on a susceptor. If this film comes off, dust is generated thereby causing a defective epitaxial film to be formed on the wafer. For this reason, the deposited film needs to be removed.

A SiC film deposited on a susceptor during the SiC film formation process can be removed by an etching process. The end of cleaning is conventionally controlled by the thickness of a SiC film formed in the SiC film formation process and the length of etching time. However, when the end of cleaning is controlled in such a manner, it is difficult to determine whether the SiC film deposited on the susceptor has been reliably removed or not. Therefore, cleaning is conventionally performed for a longer time than calculated.

However, such a method wastes time on unnecessary cleaning, and further there is also a fear that a SiC coating film constituting the susceptor is also damaged.

Japanese Patent Application Laid Open No. 9-78267 proposes a method for monitoring the end point of cleaning. According to this method, an absorbent container containing an absorbent is provided in an exhaust system of a film-forming apparatus, and an exhaust gas is introduced into the absorbent container and a change in the temperature in the absorbent container is measured to monitor the end point of cleaning. However, this method has a problem that a change in the temperature in the absorbent container cannot be accurately detected due to degradation of the absorbent.

In view of the above problems, it is an object of the present invention to provide a semiconductor substrate manufacturing apparatus that makes it possible to remove a film deposited on a susceptor during SiC epitaxial growth and to enhance manufacturing yield.

Other challenges and advantages of the present invention are apparent from the following description.

SUMMARY OF THE INVENTION

In the aspect of the present invention, a semiconductor substrate manufacturing apparatus, said apparatus comprising: a film-forming chamber in which a SiC epitaxial film is formed on a wafer placed on a susceptor; a cleaning chamber in which SiC film deposited on the susceptor is removed; and a regeneration chamber in which SiC film is formed on the susceptor.

BRIEF DESCRIPTION OF DRAWINGS

FIG. 2A is a diagram showing a susceptor and a wafer before forming a SiC film.

FIG. 2B is a diagram showing a susceptor and a wafer after forming a SiC film.

FIG. 2C is a diagram showing a susceptor and a dummy wafer after cleaning treatment.

FIG. 2D is a diagram showing a susceptor and a dummy wafer after regeneration treatment.

DETAILED DESCRIPTION OF EMBODIMENTS

A semiconductor substrate manufacturing apparatus according to the present invention is preferably applied to a so-called vertical epitaxial growth system in which gases required for film formation are supplied from above a wafer placed on a susceptor and a heater is provided on the back surface side of the susceptor. Hereinbelow, the semiconductor substrate manufacturing apparatus according to the present invention will be described in detail with reference to the accompanying drawings.

Embodiment 1

Figure 1:
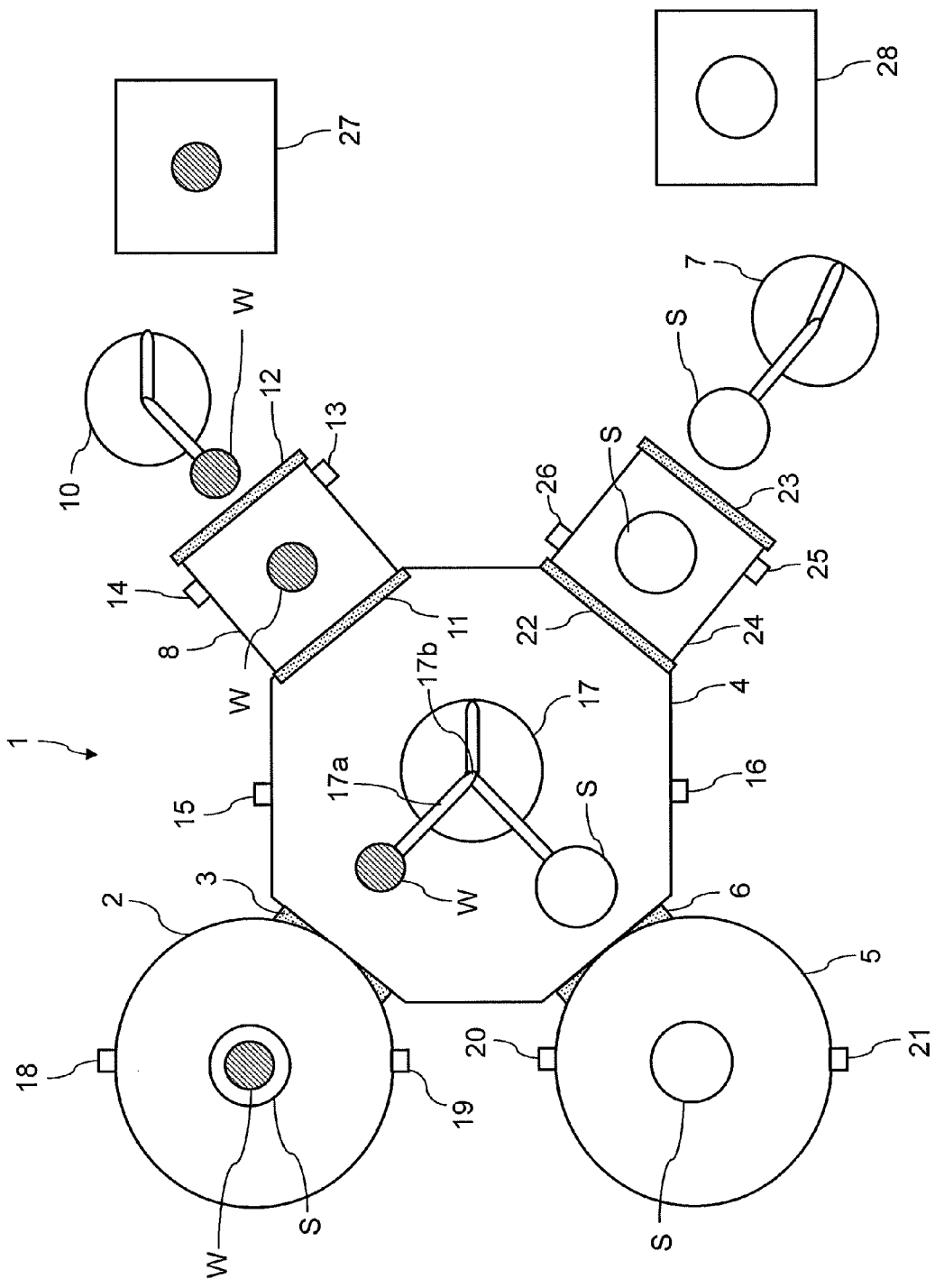
FIG. 1 is a diagram showing a sectional view from above a semiconductor substrate manufacturing apparatus according to the present invention.

FIG. 1 is a schematic sectional view of a semiconductor substrate manufacturing apparatus according to the present invention.

As shown in FIG. 1, a semiconductor substrate manufacturing apparatus 1 includes a film-forming chamber 2 in which a SiC film is formed on the surface of a wafer W placed on a susceptor S, a transport chamber 4 connected to the film-forming chamber 2 through a first open/close part 3, and a cleaning chamber 5 into which the susceptor S taken out of the film-forming chamber 2 is transported through the transport chamber 4 and a second opening/closing part 6 and in which it is cleaned.

The film-forming chamber 2 includes an inlet port 18 and an outlet port 19. The inlet port 18 is connected to a gas cylinder containing a reaction gas and a gas cylinder containing a diluent gas, via pipes (not shown), so that these gases can be supplied in appropriate amounts as needed. The outlet port 19 is connected to a vacuum pump (not shown), via a pipe (not shown), so that gas in the film-forming chamber 2 can be discharged through the outlet port 19.

In the film-forming chamber 2, a SiC epitaxial film is formed on the wafer W. For this purpose, a heater and a rotating unit are provided in the film-forming chamber 2, and the wafer W placed on the susceptor S is heated while being rotated by rotating the susceptor S. In this state, the reaction gas is brought into contact with the surface of the wafer W so that a SiC epitaxial film is formed on the surface of the wafer W.

An SiC wafer or a Si wafer can be used as the wafer W. Alternatively, another insulating substrate such as a $SiO_2$ (quartz) wafer or a high-resistance semi-insulating substrate such as a GaAs (gallium arsenide) wafer may be used.

In order to form a SiC epitaxial film, the temperature of the wafer W needs to be increased to 1500° C. or higher. For this reason, the susceptor S needs to be made of high heat-resistance material. More specifically, one obtained by, for example, coating the surface of isotropic graphite with SiC by CVD (Chemical Vapor Deposition) is used. The shape of the susceptor S is not particularly limited as long as the wafer W can be placed on the susceptor S, and may be appropriately selected. Examples thereof include a ring shape and a solid disk shape.

As the reaction gas, for example, a mixture gas obtained by mixing a silicon (Si) source gas such as silane ($SiH_4$) or dichlorosilane ($SiH_2Cl_2$), a carbon (C) source gas such as propane ($C_3H_8$) or acetylene ($C_2H_2$), and a hydrogen ($H_2$) gas used as a carrier gas is introduced.

As shown in FIG. 1, the wafers W to be subjected to film formation are transported into the film-forming chamber 2 one by one. It is to be noted that two or more wafers W may be transported into the film-forming chamber 2 to perform film formation on these wafers at the same time. In this case, film formation is performed by a combination of single-wafer processing and batch processing, thereby improving productivity of the semiconductor substrate manufacturing apparatus 1.

As described above, the temperature of the wafer W needs to be increased to a very high level during SiC epitaxial growth. However, when the wafer W is heated by the heater to increase the temperature of the wafer W, radiant heat from the heater is transferred not only to the wafer W but also to other members constituting the film-forming chamber 2 so that the temperatures thereof are increased. This phenomenon particularly occurs in members located near portions to be heated to high temperature such as the wafer W and the heater, the inner wall of the film-forming chamber 2, or the pipes. When the reaction gas comes into contact with high-temperature portions that have appeared in the film-forming chamber 2, a pyrolytic reaction of the reaction gas occurs as in the case where the reaction gas comes into contact with the surface of the wafer W heated to high temperature.

In order to form a SiC epitaxial film on the surface of the wafer W, a mixture gas prepared by mixing, for example, silane ($SiH_4$) as a Si source, propane ($C_3H_8$) as a carbon source, hydrogen gas used as a carrier gas, is used as the reaction gas. The reaction gas is supplied from outside the film-forming chamber 2 into the film-forming chamber 2 through the inlet port 18, and decomposes when reaching the surface of the wafer W which has been heated to high temperature.

However, the reaction gas having such a composition as described above is highly reactive, and therefore if the reaction gas comes into contact with a member that satisfies certain temperature conditions, a decomposition reaction occurs also on such a member other than the surface of the wafer W. As a result, a SiC film derived from the reaction gas and considered polycrystalline is deposited on members in the film-forming chamber 2, more specifically, on the susceptor S, the inner wall of the film-forming chamber 2, and pipes for discharging gas in the film-forming chamber 2. If the deposited film comes off, dust is generated so that a defective epitaxial film is formed on the surface of the wafer W. For this reason, the deposited film needs to be removed by cleaning.

Such a situation will be described with reference to FIG. 2. FIG. 2A is a diagram showing the susceptor S and the wafer W before forming a SiC film. Here, the susceptor S is composed of graphite $S_1$ and a SiC film $S_2$ coating the graphite $S_1$. FIG. 2B is a diagram showing the susceptor S and the wafer W after forming a SiC film. As can be seen from FIGS. 2A and 2B, a single-crystalline SiC film 301 is formed on the surface of the wafer W and a SiC film 302 considered polycrystalline is formed on the surface of the susceptor S during SiC epitaxial growth.

Therefore, according to Embodiment 1, as will be described below, the SiC film 302 deposited on the susceptor S is removed in the cleaning chamber 5. The SiC film deposited on the inner wall of the film-forming chamber 2 can be removed by etching, by supplying an etching gas such as $ClF_3$ gas into the film-forming chamber 2 through the inlet port 18 when the temperature inside the film-forming chamber 2 is high, more specifically, equal to 400° C. or higher.

Similarly to the susceptor S, the inner wall of the film-forming chamber 2 is one obtained by coating the surface of isotropic graphite with SiC by CVD (Chemical Vapor Deposition). Therefore, the amount of etching during removal of the SiC film deposited on the inner wall is preferably controlled by time. It can be considered that the SiC film deposited on the inner wall is a nondense and polycrystalline film different from a dense and polycrystalline SiC film constituting the inner wall. It is conceivable that the etching rate of the nondense and polycrystalline SiC film will be higher than that of the dense and polycrystalline SiC film. However, these films have the same composition, and therefore it can be considered that selectivity of etching using 100% $ClF_3$ gas is not sufficient. For this reason, cleaning treatment is performed using $ClF_3$ gas diluted to 10 to 20% with hydrogen gas. Usually, etching of single-crystalline SiC film is performed using 100% $ClF_3$ gas. However, in this case, by using diluted $ClF_3$ gas, a clear difference can be made between the etching rate of the dense and polycrystalline SiC film and the etching rate of the nondense and polycrystalline SiC film. That is, the SiC film deposited on the inner wall can be removed by etching without substantially etching the SiC film constituting the inner wall by controlling the end point of etching by time by using the difference in etching rate. It is to be noted that the nondense and polycrystalline SiC film deposited on the pipes is removed by dismantling the pipes and cleaning them with an appropriate chemical solution.

After the completion of film formation in the film-forming chamber 2, the first open/close part 3 is opened, and the wafer W is transported into the transport chamber 4 by a transport robot.

The transport chamber 4 also includes an inlet port 15 and an outlet port 16. The inlet port 15 is connected to a gas cylinder, containing nitrogen gas, via a pipe (not shown), so that nitrogen gas can be introduced into the transport chamber 4. The outlet port 16 is connected to a vacuum pump (not shown), via a pipe (not shown), so that gas in the transport chamber 4 can be discharged through the outlet port 16.

The transport robot 17 has a part on which the susceptor S or the wafer W is to be placed, and this part is connected to a rotating member 17a. The rotating member 17a is configured so that the distance from a supporting point 17b to the part on which the susceptor S or the wafer W is to be placed can be adjusted. The transport robot 17 is made of heat-resistance material made from, as one example, silicon coated carbon.

The part of the transport robot 17 on which the wafer W or the susceptor S is to be placed can have a heater or a lamp. This makes it possible to prevent rapid temperature change even when the high-temperature wafer W or susceptor S after being taken out of the film-forming chamber 2 or the cleaning chamber is placed on the part. For example, a heater having a tape-like structure obtained by coating a heating wire with a flexible heat-resistance resin may be provided in the part on which the susceptor S or the wafer W is to be placed so that the temperature of the part on which the wafer W or the susceptor S is to be placed can be adjusted by generating heat by the passage of current through the heating wire. It is to be noted that the transport chamber 4 may be configured so that the entire transport chamber 4 can be externally heated without allowing the transport robot 17 to have a heater or lamp.

After the wafer W is transported into the transport chamber 4, a third open/close part 11 is opened and the wafer W is transported into a first load lock chamber 8 by the transport robot 17.

The first load lock chamber 8 includes an inlet port 13 and an outlet port 14 so that gas in the first load lock chamber 8 can be discharged through the outlet port 14 with the use of, for example, a vacuum pump, and nitrogen gas or argon gas, introduced into the first load lock chamber 8 through the inlet port 13. Further, the first load lock chamber 8 includes a fourth open/close part 12 so that the wafer W can be transported into the first load lock chamber 8 from the outside or the wafer W can be transported from the first load lock chamber 8 to the outside by opening the fourth open/close part 12.

The wafer W, after film formation, is transported into the first load lock chamber 8 through the third open/close part 11, the third open/close part 11 is closed and nitrogen gas is introduced through the inlet port 13 to return the pressure in the first load lock chamber 8 to atmospheric pressure. Then, the fourth open/close part 12 is opened and the wafer W is stored in a cassette 27 by a wafer transport robot 10. Before film formation the wafer W is transported into the first load lock chamber 8 by opening the fourth open/close part 12 with the third open/close part 11 being closed. By providing the first load lock chamber 8, it is possible to prevent outside air from directly entering the transport chamber 4, the film-forming chamber 2, and the cleaning chamber 5. Particularly, it is possible to prevent moisture and organic matter contained in air from entering the film-forming chamber 2, thereby preventing their adverse effects on film formation.

In the semiconductor substrate manufacturing apparatus 1 according to Embodiment 1, the transport chamber 4 is connected to the cleaning chamber 5 through the second open/close part 6. In the cleaning chamber 5, the susceptor S that has been used for film formation in the film-forming chamber 2 is cleaned. That is, the cleaning chamber 5 is provided for the purpose of removing the SiC film deposited on the susceptor S during SiC epitaxial growth. By providing the cleaning chamber 5 in the semiconductor substrate manufacturing apparatus 1, it is possible to eliminate the necessity of suspending film formation to perform cleaning treatment in the film-forming chamber 2, that is, it is possible to perform cleaning treatment in the cleaning chamber 5 concurrently with film formation performed in the film-forming chamber 2, thereby enhancing the efficiency of film formation.

The cleaning chamber 5 includes an inlet port 20 and an outlet port 21. The inlet port 20 is connected to a gas cylinder containing an etching gas, via a pipe (not shown) so that the gas can be supplied in an appropriate amount into the cleaning chamber 5 during cleaning treatment. The outlet port 21 is connected to a vacuum pump (not shown), via a pipe (not shown), so that gas in the cleaning chamber 5 can be discharged through the outlet port 21.

For the etching gas, $ClF_3$ gas is preferably used. When supplied into the cleaning chamber 5, $ClF_3$ gas reacts with SiC according to the following formula (1), as mentioned in the following document: Y. Miura, H. Habuka, Y. Katsumi, O. Oda, Y. Fukai, K. Fukae, T. Kato, H. Okumura, K. Arai, 'Japanese Journal of Applied Physics.' Vol. 46, No. 12, 2007, pp. 7875-7879.

$$3SiC + 8ClF_3 \rightarrow 3SiF_4 + 3CF_4 + 4Cl_2 \quad \text{Formula (1)}$$

The SiC film deposited on the susceptor S is removed by etching based on the reaction.

Further, the cleaning chamber 5 includes a heater so that the susceptor S can be heated during cleaning treatment. As an example, a heater for resistance heating made of SiC material is used. The heater can be configured so as to heat the susceptor S placed in the cleaning chamber 5 from the bottom side of the susceptor S.

SiC etching using $ClF_3$ gas proceeds under high temperature. According to Embodiment 1, cleaning treatment is preferably performed at 400° C. or higher. However, if cleaning treatment is to be performed at high temperature, the entire cleaning chamber 5 needs to have high heat resistance. For this reason, cleaning treatment is preferably performed at 600° C. or less.

Further, the cleaning chamber 5 includes a rotating unit for rotating the susceptor S during cleaning.

In order to allow the reaction represented by the above formula (1) to efficiently proceed, it is necessary to efficiently supply $ClF_3$ gas as the etching gas onto the surface of SiC while three kinds of gases ($3SiF_4$, $3CF_4$, $4Cl_2$) as reaction products are efficiently removed. Therefore, the etching gas is preferably supplied from above the susceptor S when supplied into the cleaning chamber 5 of the semiconductor substrate manufacturing apparatus 1, and cleaning is preferably performed while the susceptor S is rotated. When the susceptor S is rotated at a higher speed, the thickness of a region (reaction boundary layer) where the reaction gas causes a reaction becomes smaller. This makes it easy to remove the production gases and to supply the reaction gas, and therefore the etching reaction represented by the formula (1) easily occurs.

Cleaning treatment is performed, as one example, in the following manner.

First, the susceptor S that should be cleaned is transported into the cleaning chamber 5.

Then, a dummy wafer is placed on the susceptor S in an area where the wafer W has been placed during film formation performed in the film-forming chamber 2. There is no deposited SiC film on the susceptor S in an area where the wafer W has been placed, and therefore if cleaning treatment is performed without placing a dummy wafer, the SiC film in this area constituting the susceptor S is etched. For this reason, a dummy wafer is placed to prevent the SiC film constituting the susceptor S from being etched. It is to be noted that the dummy wafer is transported into the transport chamber 4 through the first load lock chamber 8, and is then transported into the cleaning chamber 5 by the transport robot 17.

Then, the susceptor S is rotated at about 50 rpm. Further, the susceptor S is heated by the heater. Then, after it is confirmed that the temperature of the susceptor S has reached 400° C. or higher, determining measurement by using, for example, a radiation thermometer, the number of revolutions of the susceptor S is gradually increased. The number of revolutions of the susceptor S is preferably in the range of 300 to 900 rpm. However, the number of revolutions of the susceptor S during cleaning treatment does not need to be as strict as that during film formation.

Then, the etching gas is supplied from above the susceptor S so as to flow downward toward the susceptor S. At this time, the etching gas is preferably straightened by a straightening vane such as a shower plate. The etching gas flows downward substantially vertically toward the susceptor S so that a so-called vertical flow is formed. The etching gas on the surface of the susceptor S is in a straightened state. Then, when the etching gas reaches the surface of the heated susceptor S, the reaction represented by the formula (1) occurs so that the SiC film deposited on the surface of the susceptor S is etched.

In the cleaning chamber 5, cleaning treatment can be performed on the susceptor S taken out of the film-forming chamber 2 every time after film formation is performed once in the film-forming chamber 2. Alternatively, cleaning of the susceptor S may be performed after film formation is performed a predetermined number of times. In this case, only the wafer W is taken out of the film-forming chamber 2 until a time when the number of film formations reaches a predetermined value, and when the number of film formations reaches a predetermined value, both the wafer W and the susceptor S are taken out of the film-forming chamber 2 and the susceptor S is transported into the cleaning chamber 5.

The susceptor S needs to be taken out of the film-forming chamber 2 before particles derived from the SiC film deposited on the susceptor S start to be generated. If the relationship between generation of the particles and the thickness of the SiC film deposited on the susceptor S can be predetermined, the timing of taking the susceptor S out of the film-forming chamber 2 can be determined based on the thickness of the SiC film deposited on the surface of the susceptor S. For example, when the thickness of the SiC film deposited on the susceptor S reaches 100 μm the susceptor S may be taken out of the film-forming chamber 2 together with the wafer W and cleaned. According to the present invention, the efficiency of film formation is little affected by the timing of taking the susceptor S out of the film-forming chamber 2.

It can be considered that the SiC film deposited on the surface of the susceptor S is a nondense and polycrystalline film different from a dense and polycrystalline SiC film (SiC film coating the surface of graphite) constituting the susceptor S. Here, the phrase "dense and polycrystalline" means that the SiC film is polycrystalline but is closer to a single-crystalline film than the nondense and polycrystalline SiC film.

It is conceivable that the etching rate of the nondense and polycrystalline SiC film will be higher than that of the dense and polycrystalline SiC film. However, these films have the same composition, and therefore it can be considered that selectivity of etching using 100% $ClF_3$ gas is not sufficient. Therefore, cleaning treatment uses $ClF_3$ gas diluted to 10 to 20% with hydrogen gas as an etching gas. This makes it possible to make a clear difference between the etching rate of the dense and polycrystalline SiC film and the etching rate of the nondense and polycrystalline SiC film.

However, even when $ClF_3$ gas having such composition as described above is used, it is difficult to completely prevent etching of the SiC film constituting the susceptor S. Therefore, there is a fear that graphite used as a base material is exposed by repeating cleaning treatment.

FIG. 2C is a diagram showing the susceptor S and the dummy wafer W' after cleaning treatment. As shown in FIG. 2C, the SiC film 302 deposited on the surface of the susceptor S during SiC epitaxial growth has been removed, and further part of the underlying SiC film $S_2$ has also been removed. If the SiC film $S_2$ continues to be etched by repeat cleaning treatments, there is a fear that the graphite $S_1$ will soon be exposed.

Therefore, according to Embodiment 1, treatment for regenerating SiC film is performed on the susceptor S after the completion of cleaning treatment. More specifically, a SiC film is epitaxially grown on the susceptor S in the cleaning chamber 5. In this case, as in the case of cleaning treatment, a dummy wafer is preferably placed on the susceptor S, then, a SiC film is epitaxially grown so that the level of the surface thereof becomes substantially the same as that of the surface of the SiC film located under the dummy wafer. By doing so, it is possible to regenerate the SiC film constituting the surface of the susceptor S. It is to be noted that this regeneration treatment may be performed every time after cleaning treatment is performed or may be performed every time after cleaning treatment is performed a predetermined number of times.

It is to be noted that the thickness of the SiC film of the susceptor S, coating the surface of graphite, is about 100 to 150 μm. The difference in film thickness between the SiC film under the dummy wafer and the SiC film other than the SiC film under the dummy wafer can be measured using a stylus-type film thickness meter. Therefore, a SiC film having a thickness corresponding to the film thickness difference may be formed.

Conditions for forming a SiC film on the susceptor S do not need to be as strict as those for film formation during manufacturing of a SiC epitaxial wafer. That is, the acceptable ranges of temperature etc. to be controlled during formation of a SiC film on the susceptor S are wider. Examples of conditions for forming a SiC film on the susceptor S are as follows. The film-forming rate of a SiC film under the following conditions was about 1 μm/min.

Film-formation Temperature: 1500° C.
Reaction gas: Dichlorosilane ($SiH_2Cl_2$, Abbreviation: DCS), Propane ($C_3H_8$), Hydrogen ($H_2$)
Pressure: $4 \times 10^{-4}$ Pa After SiC film regeneration treatment is performed on the susceptor S, the susceptor S is taken out of the cleaning chamber 5 and returned to the film-forming chamber 2 to continue manufacturing of a SiC epitaxial wafer.

If necessary, the susceptor S, after regeneration treatment, may be transported from the transport chamber 4 into a second load lock chamber 24 through a fifth open/close part 22 and then transported to the outside through a sixth open/close part 23.

It is to be noted that, as in the case of the susceptor S after regeneration treatment, the susceptor S after cleaning treatment may be transported from the cleaning chamber 5 into the transport chamber 4 by the transport robot 17 and then returned to the film-forming chamber 2 to be used to manufacture a SiC epitaxial wafer. Alternatively, the susceptor S after cleaning treatment may be transported from the cleaning chamber 5 into the transport chamber 4, and then transported into the second load lock chamber 24 through the fifth open/close part 22, and then transported to the outside through the sixth open/close part 23.

The second load lock chamber 24 includes an outlet port 25 and an inlet port 26 so that gas in the second load lock chamber 24 can be discharged through the outlet port 25 by using, for example, a vacuum pump, and nitrogen gas or argon gas can be introduced into the second load lock chamber 24 through the inlet port 26. Further, the susceptor S can be transported from the outside into the second load lock chamber 24 or the susceptor S can be transported from the second load lock chamber 24 to the outside by opening the sixth open/close part 23 provided in the second load lock chamber 24.

After the susceptor S is transported into the second load lock chamber 24 through the fifth open/close part 22, the fifth open/close part 22 is closed and nitrogen gas is introduced into the second load lock chamber 24 through the inlet port 26 to return the pressure in the second load lock chamber 24 to the atmospheric pressure. Then, the sixth open/close part 23 is opened and the susceptor S is stored in a cassette 28 by a susceptor transport robot 7.

When the susceptor S is transported from the cassette 28 into the second load lock chamber 24, the sixth open/close part 23 is opened with the fifth open/close part 22 being closed; the susceptor is then transported into the second load lock chamber 24. Then, the sixth open/close part 23 is closed and air in the second load lock chamber 24 is exhausted through the outlet port 25 by using, for example, a vacuum pump. Then, nitrogen gas is introduced into the second load lock chamber 24 through the inlet port 26. It is to be noted that argon gas or the like may be introduced instead of nitrogen gas. Then, the fifth open/close part 22 is opened to transport the susceptor S into the transport chamber 4.

By providing the second load lock chamber 24, it is possible to prevent outside air from directly entering the transport chamber 4, the film-forming chamber 2, and the cleaning chamber 5. Particularly, it is possible to prevent moisture and organic matter contained in air from entering the film-forming chamber 2, thereby preventing their adverse effects on film formation.

Figure 3:
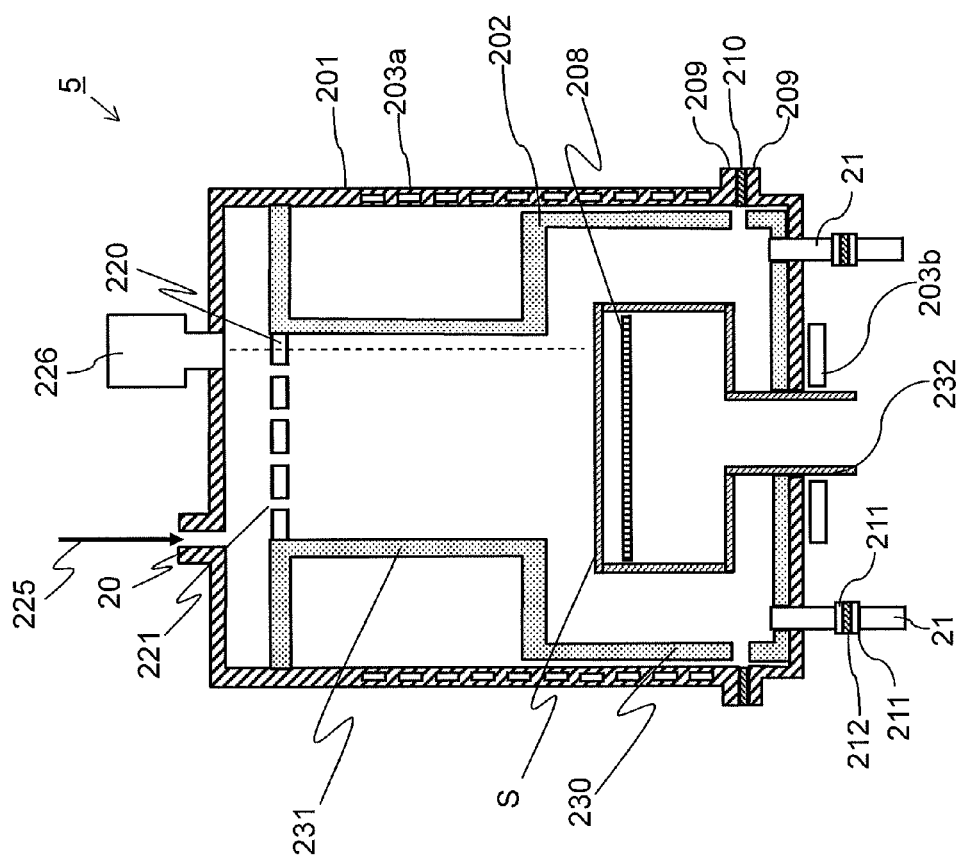
FIG. 3 is a schematic sectional view showing the structure of one example of the cleaning chamber according the First Embodiment.

FIG. 3 is a schematic sectional view showing the structure of one example of the cleaning chamber according to this embodiment. This cleaning chamber also serves as a regeneration chamber in which SiC film regeneration treatment is performed. It is to be noted that, according to this embodiment, the regeneration chamber may be provided separately from the cleaning chamber or the film-forming chamber may also serve as the regeneration chamber. However, the cleaning chamber configured to also serve as the regeneration chamber is more versatile and is advantageous in that the amount of dust introduced into the film-forming chamber can be reduced.

In FIG. 3, reference numeral 201 denotes a chamber, reference numeral 202 denotes a hollow cylindrical liner that covers and protects a chamber inner wall, reference numerals 203a and 203b denote channels of cooling water used for cooling the chamber, reference numeral 20 denotes an inlet port through which $ClF_3$ gas is introduced, reference numeral 21 denotes an outlet port through which $ClF_3$ gas is discharged after reaction, reference symbol S denotes a susceptor, reference numeral 208 denotes a heater that is supported by a supporting unit (not shown) and heats the susceptor S, reference numeral 209 denotes a flange portion through which upper and lower parts of the chamber 201 are connected to each other, reference numeral 210 denotes a gasket that seals the flange portion 209, reference numeral 211 denotes a flange portion through which the outlet port 21 and a pipe are connected to each other, and reference numeral 212 denotes a gasket that seals the flange portion 211.

The liner 202 includes a head part to which a shower plate 220 is fitted. The shower plate 220 is a gas straightening vane having the function of uniformly supplying an etching gas 225 onto the surface of the susceptor S.

In the cleaning chamber 5, the susceptor S is heated by the heater 208 while being rotated by the rotating unit to perform cleaning treatment. The rotating unit 232 includes a drum 232a and a shaft 232b, and is connected to a rotating system (not shown) outside the chamber 201. The rotating unit 232 is configured to rotate at a predetermined number of revolutions about a line that is orthogonal to the center of its transverse cross section and acts as a rotation axis. During cleaning treatment, an etching gas for etching SiC film is supplied by an etching gas supply system from above the susceptor S while the susceptor S is rotated. More specifically, the etching gas 225 is supplied from the inlet port 20 into the chamber 201 through through-holes 221 of the shower plate 220. The head part 231 of the liner 202 has an inner diameter smaller than that of a body part 230 of the liner 202 in which the susceptor S is placed. The etching gas 225 flows downward through the head part 231 toward the surface of the susceptor S.

In the cleaning chamber 5, the susceptor S is heated by the heater 208 provided under the susceptor S. It is to be noted that the shape of the heater is not limited to a structure shown in FIG. 3. Further, the susceptor S may be heated by also using another heater for heating the outside of the substrate in conjunction with the heater 208.

Figure 4:
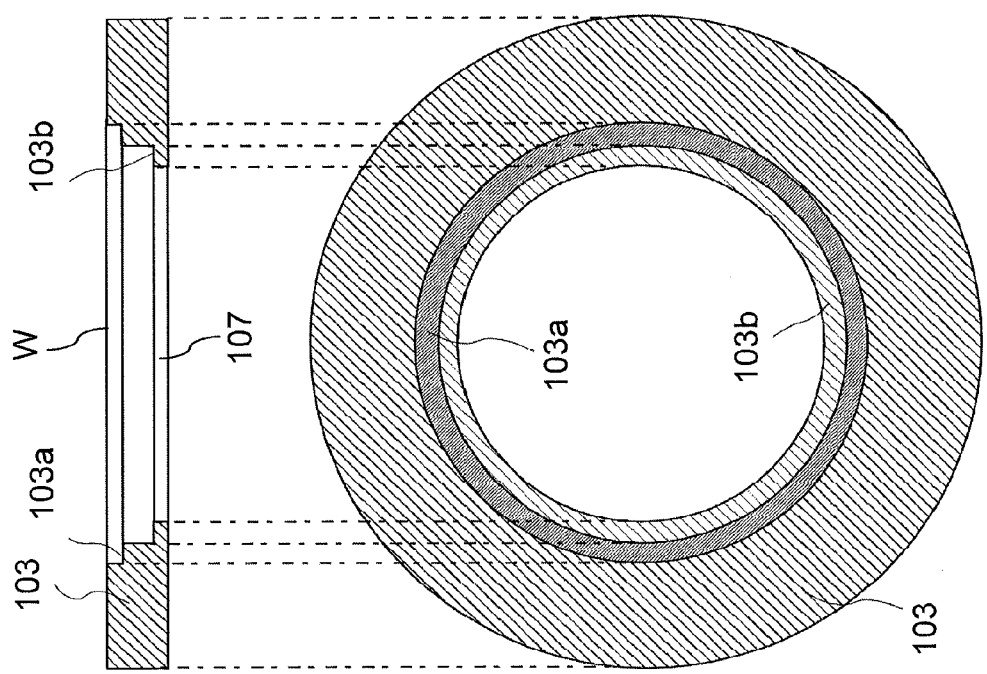
FIG. 4 is a sectional view of a susceptor on which the wafer is being placed and a plan view corresponding to the sectional view according to First Embodiment.

In FIG. 4, the susceptor S has a solid disk shape. During film formation performed in the film-forming chamber 2, the wafer W is placed on the susceptor S. It is to be noted that the shape of the susceptor S is not limited thereto, and the susceptor S may be, for example, a ring shape without the second member 107.

FIG. 4 shows a sectional view of another example of the susceptor S on which the wafer W is being placed and a plan view corresponding to the sectional view. As shown in FIG. 4, the susceptor S includes a first member 103 that supports the wafer W and a second member 107 that is supported by the first member 103 and spaced apart from the wafer W by a predetermined distance.

During film formation, the first member 103 is placed on an upper part of a substantially cylindrical rotating member (not shown) that is made of SiC and provided in the film-forming chamber 2. The first member 103 has a ring shape having an opening in its center, and the inner end thereof has upper and lower two-stepped spot-faced portions. The wafer W is placed on a first upper spot-faced portion 103a. The inner diameter of the first spot-faced portion 103a positions the wafer W so that the movement of the wafer W in a substantially horizontal direction can be restrained.

The depth from the upper surface of the first member 103 to the horizontal surface of the first spot-faced portion 103a is substantially the same as or smaller than the thickness of the wafer W so that when the wafer W is placed on the first spot-faced portion 103a, the level of the upper surface of the wafer W is substantially the same as or higher than that of the upper surface of the first member 103. Therefore, when $ClF_3$ gas flows in the direction from around the center to the periphery of the wafer W, the flow of the $ClF_3$ gas is not blocked by the vertical surface of the first spot-faced portion 103a so that the $ClF_3$ gas flows smoothly.

In the susceptor S, the second member 107 is placed on a second lower spot-faced portion 103b. The second member 107 has a diameter larger than that of an opening formed in the center of the ring-shaped first member 103, and the circumferential end of the second member 107 is flanged. Therefore, the second member 107 is placed so as to be suspended by the horizontal surface of the second spot-faced portion 103b. As a result, the first member 103 is brought into a state where the opening thereof is covered with the second member 107. The susceptor S is completed by combining the first member 103 with the second member 107 by placing the second member 107 on the second spot-faced portion 103b.

By allowing the susceptor S to have such a shape as shown in FIG. 3 or 4, it is possible to substantially separate the cleaning chamber 5 into an area where the etching gas is supplied to perform cleaning treatment and an area inside the rotating unit 232 and under the susceptor S. This makes it possible to prevent the corrosion of devices and electrical wiring installed inside the rotating unit 232 with the etching gas.

The rotating system or reaction gas supply system of the film-forming chamber 2 can have the same structure as that of the cleaning chamber 5 shown in FIG. 3, and therefore the film-forming chamber 2 also can obtain the same effect as long as the susceptor S has the above-described shape. That is, the film-forming chamber 2 is separated into an area where film formation is performed and an area inside the rotating unit and under the susceptor S, thereby preventing the corrosion of metals constituting devices and electrical wiring installed inside the rotating unit with the reaction gas. In addition, impurities derived from these metals are less likely to enter the area in which film formation is performed. This makes it possible to prevent an epitaxial film formed on the wafer W from being contaminated with impurities, thereby preventing the deterioration of the quality of the epitaxial film.

As described above, in the cleaning chamber 5, the susceptor S is heated by the heater 208 while being rotated to perform cleaning treatment. More specifically, the etching gas 225 is supplied from the inlet port 20 into the chamber 201 through the through-holes 221 of the shower plate 220 while the susceptor S is rotated. The head part 231 of the liner 202 has an inner diameter smaller than that of the body part 230 of the liner 202 in which the susceptor S is placed. The etching gas 225 flows downward through the head part 231 toward the surface of the susceptor S.

When the etching gas 225 reaches the surface of the susceptor S, the reaction represented by the above formula (1) occurs so that the SiC film deposited on the surface of the susceptor S is etched. Then, gases produced by the reaction and unreacted $ClF_3$ gas are discharged through the outlet port 21 provided in the lower part of the chamber 201 as required.

The flange portion 209 of the chamber 201 and the flange portion 211 of the outlet port 21 are sealed with the gasket 210 and the gasket 212, respectively. The channels 203a and 203b for circulating cooling water are provided around the outer periphery of the chamber 201 to prevent thermal degradation of the gaskets 210 and 212.

The temperature during cleaning treatment is preferably between the temperatures of 400° C. and 600° C.

The surface temperature of the susceptor S can be measured by a radiation thermometer 226 provided in the upper part of the chamber 201. A specific example of the radiation thermometer 226 includes a fiber radiation thermometer. This thermometer includes an optical lens that condenses radiant light emitted from a measurement object, an optical fiber that transmits radiant light condensed by the optical lens to a temperature converter, a lens holder that holds the optical lens, a light-receiving portion case that supports and fixes the end face of the optical fiber, and a temperature converter that measures the temperature of a measurement object based on the intensity of light transmitted by the optical fiber. For example, when the shower plate 220 is made of transparent quartz, radiant light emitted from the susceptor S can pass through the shower plate 220 and is therefore received by the radiation thermometer 226. Measured temperature data is sent to a control system (not shown), and is then fed back to control the output of the heater 208. This makes it possible to heat the susceptor S to a desired temperature. However, temperature control during cleaning treatment does not need to be as strict as that during film formation.

Hereinbelow, SiC film regeneration treatment performed in the cleaning chamber 5 will be described. It is to be noted that conditions for forming a SiC film on the susceptor S do not need to be as strict as those for film formation during manufacturing of a SiC epitaxial wafer, and therefore the acceptable ranges of temperature etc. to be controlled during regeneration treatment can be made wider than the following examples.

First, a dummy wafer is placed on the susceptor S after cleaning treatment, and the susceptor S is rotated at about 50 rpm.

The heater 208 is operated by supplying a current to heat the susceptor S by heat emitted by the heater 208. The susceptor S is gradually heated until the temperature thereof reaches a predetermined value between 1500° C. and 1700° C. at which a SiC film is formed (e.g., 1650° C.). At this time, an excessive increase in the temperature of the chamber 201 can be prevented by allowing cooling Water to flow through the channels 203a and 203b provided in and near the wall of the chamber 201.

After the temperature of the susceptor S measured by the radiation thermometer 226 reaches 1650° C., the number of revolutions of the susceptor S is gradually increased. For example, the number of revolutions of the susceptor S may be increased to 900 rpm.

A reaction gas is supplied through the inlet port 20 and is allowed to flow downward through the shower plate 220 toward the surface of the susceptor S. At this time, the reaction gas is straightened when passing through the shower plate 220 as a straightening vane, and flows downward substantially vertically toward the susceptor S located under the shower plate 220 so that a so-called vertical flow is formed.

As the reaction gas, for example, a mixture gas obtained by mixing a silicon (Si) source gas such as silane ($SiH_4$) or dichlorosilane ($SiH_2Cl_2$), a carbon (C) source gas such as propane ($C_3H_8$) or acetylene ($C_2H_2$), and hydrogen ($H_2$) gas used as a carrier gas.

For example, film formation can be performed using, as the reaction gas, a mixture gas of dichlorosilane ($SiH_2Cl_2$), tetrachlorosilane ($SiCl_4$, abbreviation: TCS), methane ($CH_4$), hydrogen ($H_2$), and nitrogen ($N_2$) at a temperature of 1450 to 1550° C. and a pressure of $1.3 \times 10^{-4}$ Pa to $9.3 \times 10^{-4}$ Pa.

When reaching the surface of the susceptor S, the reaction gas causes a pyrolytic reaction or a hydrogen reduction reaction so that a SiC film is formed on the surface of the susceptor S. The reaction gas other than that used for a vapor-phase growth reaction is turned into a denatured production gas and discharged through the outlet port 21 provided in the lower part of the chamber 201.

After the formation of a SiC film having a predetermined film thickness on the surface of the susceptor S, supply of the reaction gas is stopped. Then, after it is confirmed that the susceptor S has been cooled to a predetermined temperature, the susceptor S is taken out of the cleaning chamber 5.

FIG. 2D is a diagram showing the susceptor S and a dummy wafer W" after regeneration treatment. It is to be noted that the dummy wafer W" may be the same as the wafer W' shown in FIG. 2C.

As shown in FIG. 2D, a SiC film 303 is formed on the susceptor S and the dummy wafer W" by regeneration treatment. As a result, the thickness of the SiC film $S_2$ that is located under the dummy wafer W" and appears by removing the dummy wafer W" from the surface of the susceptor S becomes substantially the same as that of the SiC film (total thickness of the SiC film $S_2$ and the SiC film 303) in an area other than the area where the dummy wafer W" has been placed. It can be seen from the result that the SiC film constituting the susceptor S has been regenerated.

As described above, the semiconductor substrate manufacturing apparatus according to this embodiment makes it possible to perform regeneration treatment of a SiC film constituting the surface of a susceptor. Therefore, even when a SiC film constituting a susceptor is removed together with a film deposited on the susceptor during SiC epitaxial growth by etching using $ClF_3$ gas, the SiC film can be regenerated by the regeneration treatment. Accordingly, it is possible to provide a semiconductor substrate manufacturing apparatus that makes it possible to prevent defects caused by a SiC film deposited on the surface of a susceptor to enhance manufacturing yield.

Embodiment 2

A semiconductor substrate manufacturing apparatus according to another embodiment of the present invention includes a film-forming chamber in which a SiC epitaxial film is formed on a wafer placed on a susceptor, a cleaning chamber in which a SiC film deposited on the susceptor is removed, and a regeneration chamber in which a SiC film is formed on the surface of the susceptor. The cleaning chamber can also serve as the regeneration chamber. The cleaning chamber is connected to the film-forming chamber through a transport chamber via the transport robot for transporting the susceptor.

The cleaning chamber includes a heater for heating the susceptor at a temperature of 400° C. or higher, and an etching gas supply system to supply etching gas from above the susceptor to remove a SiC film. The cleaning chamber further includes a rotating unit for rotating the susceptor at 300 to 900 rpm.

As described above, the semiconductor substrate manufacturing apparatus according to the second embodiment has the same structure as the semiconductor substrate manufacturing apparatus according to the first embodiment described with reference to FIG. 1. Therefore, the semiconductor substrate manufacturing apparatus according to Embodiment 2 will be described below with reference to FIG. 1. However, Embodiment 2 is characterized in that the cleaning chamber has a chlorine gas detector, which will be described with reference to FIG. 5.

According to Embodiment 2, the end of cleaning treatment is determined not by time but by the amount of a gas discharged during cleaning treatment.

For example, when $ClF_3$ gas is used as an etching gas, $ClF_3$ gas supplied into the cleaning chamber reacts with SiC according to the following formula (2) so that a SiC film deposited on the susceptor S is removed by etching based on the reaction.

$$3SiC+8ClF_3 \rightarrow 3SiF_4+3CF_4+4Cl_2 \quad \text{Formula (2)}$$

At this time, the amount of $Cl_2$ gas produced by the reaction represented by the formula (2) is detected, and cleaning treatment is finished when the $Cl_2$ gas can no longer be produced. After the completion of cleaning treatment, SiC film regeneration treatment is performed on the susceptor. This is because not only the SiC film deposited on the susceptor during SiC film formation but also a SiC film constituting the susceptor is etched by cleaning treatment.

The process of SiC film regeneration is performed in the same manner as described above with reference to the first embodiment. That is, a SiC film is epitaxially grown on the susceptor S in the cleaning chamber 5. At this time, as in the case of cleaning treatment, a dummy wafer is preferably placed on the susceptor S. Then, a SiC film is epitaxially grown until the level of the surface of the SiC film becomes substantially the same as that of a SiC film located under the dummy wafer. In this way, the SiC film constituting the surface of the susceptor S can be regenerated. It is to be noted that, according to Embodiment 2, this regeneration treatment is performed every time cleaning treatment is finished.

After SiC film regeneration treatment is performed on the susceptor S, the susceptor S is taken out of the cleaning chamber 5 and returned to the film-forming chamber 2, and continues to be used to manufacture a SiC epitaxial wafer.

If necessary, the susceptor S after regeneration treatment may be transported from the transport chamber 4 into the second load lock chamber 24 through the fifth open/close part 22 and then transported to the outside through the sixth open/close part 23.

As in the case of the susceptor S after regeneration treatment, the susceptor S, after cleaning treatment may also be transported from the cleaning chamber 5 into the transport chamber 4 by the transport robot 17 and then returned to the film-forming chamber 2 to be used to manufacture a SiC epitaxial wafer.

Alternatively, the susceptor S after cleaning treatment transported from the cleaning chamber 5 into the transport chamber 4 may be transported into the second load lock chamber 24 through the fifth open/close part 22 and then transported to the outside through the sixth open/close part 23.

Figure 5:
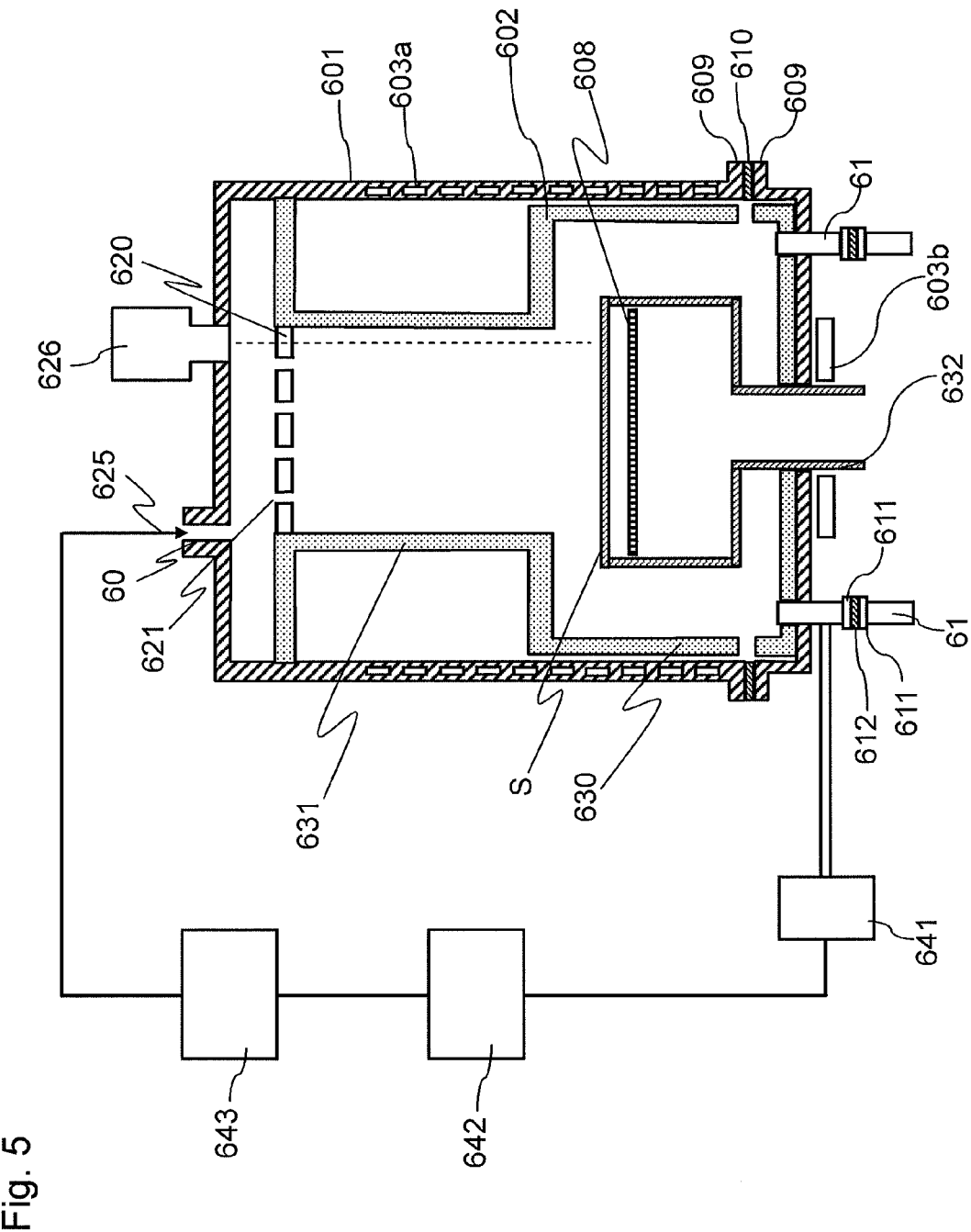
FIG. 5 is a schematic sectional view showing one example of the structure of the cleaning chamber according to the Second Embodiment.

FIG. 5 is a schematic sectional view showing the structure of one example of the cleaning chamber according to Embodiment 2. This cleaning chamber also serves as a regeneration chamber in which SiC film regeneration treatment is performed. It is to be noted that according to this embodiment, the regeneration chamber may be provided separately from the cleaning chamber or the film-forming chamber may also serve as the regeneration chamber. However, the cleaning chamber configured to also serve as the regeneration chamber is more versatile and is advantageous in that dust introduced into the film-forming chamber can be reduced.

In FIG. 5, reference numeral 601 denotes a chamber, reference numeral 602 denotes a hollow cylindrical liner that covers and protects a chamber inner wall, reference numerals 603a and 603b denote channels of cooling water for cooling the chamber, reference numeral 60 denotes an inlet port through which $ClF_3$ gas is introduced, reference numeral 61 denotes an outlet port through which $ClF_3$ gas is discharged after reaction, reference symbol S denotes a susceptor, reference numeral 608 denotes a heater that is supported by a supporting unit (not shown) and heats the susceptor S, reference numeral 609 denotes a flange portion through which upper and lower parts of the chamber 601 are connected to each other, reference numeral 610 denotes a gasket that seals the flange portion 609, reference numeral 611 denotes a flange portion through which the outlet port 61 and a pipe are connected to each other, and reference numeral 612 denotes a gasket that seals the flange portion 611.

The liner 602 has a head part to which a shower plate 620 is fitted. The shower plate 620 is a gas straightening vane having the function of uniformly supplying an etching gas 625 onto the surface of the susceptor S.

In the cleaning chamber 5 shown in FIG. 1, the susceptor S is heated by the heater 608 while being rotated by a rotating unit to perform cleaning treatment. The rotating unit 632 includes a drum 632a and a shaft 632b, and is connected to a rotating system (not shown) outside the chamber 601. The susceptor S transported from the transport chamber 4 shown in FIG. 1 is placed on the upper part of drum 632a. The rotating unit'632 is configured to rotate at a predetermined number of revolutions about a line that is orthogonal to the center of its transverse cross section and acts as a rotating axis. During cleaning treatment, an etching gas for etching SiC film is supplied by an etching gas supply system from above the susceptor S while the susceptor S is rotated. More specifically, the etching gas 625 is supplied from the inlet port 60 into the chamber 601 through through-holes 621 of the shower plate 620. The head part 631 of the liner 602 has an inner diameter smaller than that of a body part 630 of the liner 602 in which the susceptor S is placed. The etching gas 625 flows downward through the head part 631 toward the surface of the susceptor S.

In the cleaning chamber shown in FIG. 5, the susceptor S is heated by the heater 608 provided under the susceptor S. It is to be noted that the shape of the heater is not limited to a structure shown in FIG. 5. Further, the susceptor S may be heated by also using another heater for heating the outside of the substrate in conjunction with the heater 608.

As described above, in the cleaning chamber 5, the susceptor S is heated by the heater 608 while being rotated to perform cleaning treatment. More specifically, the etching gas 625 is supplied from the inlet port 621 into the chamber 601 through the through-holes 621 of the shower plate 620 while the susceptor S is rotated. The head part 631 of the liner 602 has an inner diameter smaller than that of the body part 630 of the liner 602 in which the susceptor S is placed. The etching gas 625 flows downward through the head part 631 toward the surface of the susceptor S.

When the etching gas 625 reaches the surface of the susceptor S, the reaction represented by the above formula (2) occurs so that a SiC film deposited on the surface of the susceptor S is etched. Then, gases produced as a result of the reaction, and unreacted $ClF_3$ gas, are discharged through the outlet port 61 provided in the lower part of the chamber 601 as required.

The flange portion 609 of the chamber 601 and the flange portion 611 of the outlet port 61 are sealed with the gasket 610 and the gasket 612, respectively. The channels 603a and 603b for circulating cooling water are provided around the outer periphery of the chamber 601 to prevent thermal degradation of the gaskets 610 and 612.

The temperature during cleaning treatment is preferably between 400° C. and 600° C. The surface temperature of the susceptor S can be measured by a radiation thermometer 626 provided in the upper part of the chamber 601. For example, when the shower plate 620 is made of transparent quartz, radiant light emitted from the susceptor S can pass through the shower plate 620 and is therefore received by the radiation thermometer 626. Measured temperature data is sent to a control system (not shown), and is then fed back to control the output of the heater 608. This makes it possible to heat the susceptor S to a desired temperature. However, temperature control during cleaning treatment does not need to be as strict as that during film formation.

The cleaning chamber according to this embodiment includes a chlorine gas detector 641. The chlorine gas detector 641 is provided for the purpose of detecting $Cl_2$ gas produced by the reaction represented by the formula (2). An example of the $Cl_2$ gas detector 641 includes a gas monitor manufactured by Riken Keiki Co., Ltd. (trade name: FP-300). As shown in FIG. 5, the chlorine gas detector 641 is preferably provided near the outlet port 61.

For example, a determination can be made that $Cl_2$ gas produced by the reaction represented by the formula (2) has become undetectable when one minute has passed after the concentration of $Cl_2$ gas detected by the $Cl_2$ gas detector 641 becomes 0.2 ppm or less. It is to be noted that, in this case, the $Cl_2$ gas concentration or length of elapsed time can be appropriately determined. For example, the cleaning chamber can be configured so that data of the concentration of $Cl_2$ measured by the $Cl_2$ gas detector 641 is sent to a control unit 624 and, when the control unit 624 determines that the production of $Cl_2$ gas has become undetectable, a warning alarm is generated and supply of the etching gas 625 from an etching gas supply unit 643 is stopped.

When a determination is made that $Cl_2$ gas has become undetectable by measurement of the concentration of $Cl_2$ gas using the $Cl_2$ gas detector 641, cleaning treatment is finished. Then, SiC film regeneration treatment is performed on the susceptor S. This regeneration treatment can be performed in the same manner as described above with reference to the first embodiment.

After the formation of a SiC film having a predetermined thickness on the surface of the susceptor S, supply of the reaction gas for regeneration treatment is stopped. Then, after it is confirmed that the susceptor S has been cooled to a predetermined temperature, the susceptor S is taken out of the cleaning chamber.

As described above, the semiconductor substrate manufacturing apparatus according to this embodiment makes it possible to accurately determine the end point of cleaning treatment. Further, even when a SiC film constituting a susceptor is removed by cleaning treatment, the SiC film can be regenerated by performing SiC film regeneration treatment on the susceptor after the completion of cleaning treatment. According to Embodiment 2 of the present invention, it is possible to provide a semiconductor substrate manufacturing apparatus that makes it possible to prevent defects caused by a SiC film deposited on the surface of a susceptor to enhance manufacturing yield.

The features and advantages of the present invention may be summarized as follows:

According to the present invention, it is possible to provide a semiconductor substrate manufacturing apparatus that makes it possible to remove a film deposited on a susceptor during SiC epitaxial growth and to enhance manufacturing yield.

The present invention is not limited to the above-mentioned embodiments and may be utilized without departing from the spirit and scope of the present invention.

Figure 6:
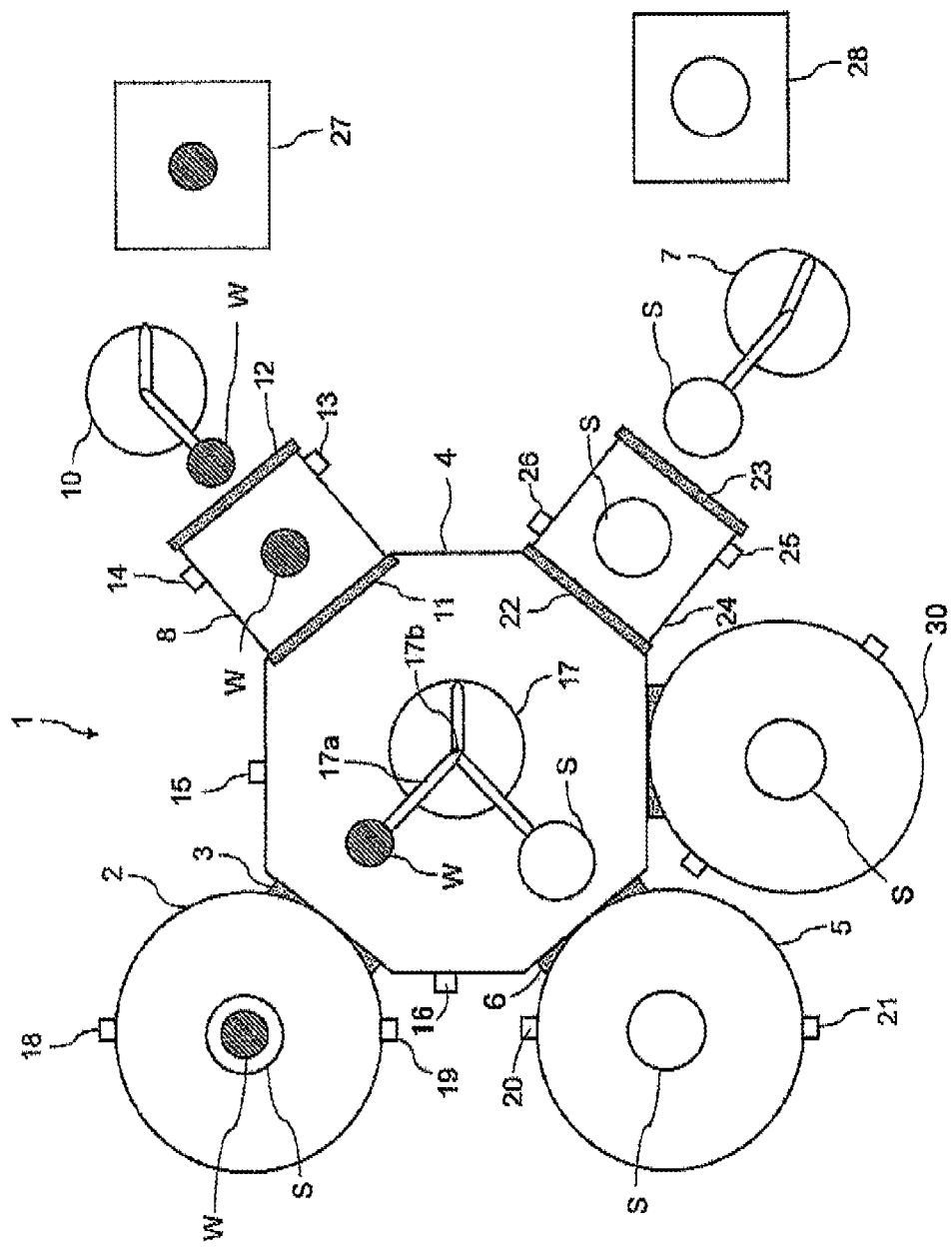
FIG. 6 is a diagram showing a sectional view from above of a semiconductor substrate manufacturing apparatus according to an embodiment.

For example, each of the semiconductor substrate manufacturing apparatuses according to the above embodiments is characterized by including a film-forming chamber 2 in which a SiC epitaxial film is formed on a wafer placed on a susceptor, a cleaning chamber 5 in which a SiC film deposited on the susceptor is removed, and a regeneration chamber 30 in which a SiC film is formed on the surface of the susceptor. FIG. 6 shows the semiconductor substrate manufacturing apparatus comprising the film-forming chamber 2, the cleaning chamber 5, and the regeneration chamber 30. Therefore, cleaning treatment is not limited to etching using $ClF_3$ gas, and may be performed by another method. By providing the regeneration chamber 30, it is possible to regenerate a SiC film constituting the surface of a susceptor which is damaged by cleaning treatment. Therefore, the semiconductor substrate manufacturing apparatus makes it possible to prevent defects caused by a SiC film deposited on the surface of a susceptor and enhance manufacturing yield.

Further, according to each of the above embodiments, the etching gas used in cleaning treatment is $ClF_3$ gas, but is not limited thereto. Therefore, the detection unit described in the second embodiment is not particularly limited as long as it can detect a gas produced by a reaction between a SiC film and an etching gas. The control unit may be configured to receive a detection result from the detection unit and to, when determining that a reaction between a SiC film and an etching gas has been completed, send a signal to the etching gas supply system to stop the supply of the etching gas into the cleaning chamber. The control unit is preferably configured to generate a warning alarm, when it is determined that a reaction between a SiC film and an etching gas has been completed. The control unit may determine that a reaction between a SiC film and an etching gas has been completed when a predetermined length of time has passed, after the concentration of the etching gas reaches a predetermined level or lower.

Obviously many modifications and variations of the present invention are possible in the light of the above teachings. It is therefore to be understood that within the scope of the appended claims the invention may be practiced otherwise than as specifically described.

What is claimed is:

1. A semiconductor substrate manufacturing apparatus including a film-forming chamber in which an SiC epitaxial film is formed on an SiC wafer, the apparatus comprising:
a cleaning chamber in which a susceptor having an SiC film formed thereon in the film-forming chamber is introduced, the cleaning chamber comprising:
a first inlet port introducing a cleaning gas into the cleaning chamber, the cleaning gas removing the SiC film,
a first outlet port discharging a gas from the cleaning chamber,
a first rotating unit on which the susceptor is placed, and
a first heater heating the susceptor;
a regeneration chamber in which the susceptor from which the SiC film is removed in the cleaning chamber is introduced, the regeneration chamber comprising:
a second inlet port introducing a reacting gas into the regeneration chamber, the reacting gas containing an SiC source gas,
a second outlet port discharging a gas from the regeneration chamber,
a second rotating unit on which the susceptor is placed, and
a second heater heating the susceptor; and
a transport chamber connected to the film-forming chamber, the cleaning chamber, and the regeneration chamber to transport the susceptor from the film-forming chamber to the cleaning chamber and from the cleaning chamber to the regeneration chamber,
wherein the cleaning chamber includes a heater for heating the susceptor at a temperature of 400° C. or higher, and an etching gas supply system for supplying an etching gas from above the susceptor to remove the SiC film, and
wherein the cleaning chamber includes a detection unit that detects a gas produced by a reaction between the SiC film and the etching gas.

2. The semiconductor substrate manufacturing apparatus according to claim 1, wherein the detection unit is provided near the first outlet port.

3. The semiconductor substrate manufacturing apparatus according to claim 1, further comprising a control unit stopping supply of the etching gas into the cleaning chamber based on a detection result from the detection unit.

4. The semiconductor substrate manufacturing apparatus according to claim 2, further comprising a control unit stopping supply of the etching gas into the cleaning chamber based on a detection result from the detection unit.

5. The semiconductor substrate manufacturing apparatus according to claim 3, wherein the control unit generates an alarm based on a detection result from the detection unit.

6. The semiconductor substrate manufacturing apparatus according to claim 4, wherein the control unit generates an alarm based on a detection result from the detection unit.

7. The semiconductor substrate manufacturing apparatus according to claim 3, wherein the control unit determines completion of a reaction between the SiC film and the etching gas, after a predetermined length of time has passed since the concentration of a gas produced by a reaction between the SiC film and the etching gas is at a predetermined level or less.

8. The semiconductor substrate manufacturing apparatus according to claim 3, wherein the control unit is configured to determine that a reaction between the SiC film and the etching gas has been completed when a predetermined length of time has passed after the concentration of a gas produced by a reaction between the SiC film and the etching gas is at a predetermined level or less.

9. The semiconductor substrate manufacturing apparatus according to claim 4, wherein the control unit is configured to determine that a reaction between the SiC film and the etching gas has been completed when a predetermined length of time has passed after the concentration of a gas produced by a reaction between the SiC film and the etching gas is at a predetermined level or less.

10. The semiconductor substrate manufacturing apparatus according to claim 1, wherein the etching gas contains $ClF_3$ gas and the detection unit detects $Cl_2$ gas produced by a reaction between the SiC film and the ClF3 gas.

11. The semiconductor substrate manufacturing apparatus according to claim 3 wherein the etching gas contains $ClF_3$ gas and the detection unit detects $Cl_2$ gas produced by a reaction between the SiC film and the $ClF_3$ gas.

12. The semiconductor substrate manufacturing apparatus according to claim 4 wherein the etching gas contains $ClF_3$ gas and the detection unit detects $Cl_2$ gas produced by a reaction between the SiC film and the $ClF_3$ gas.

* * * * *

UNITED STATES PATENT AND TRADEMARK OFFICE
CERTIFICATE OF CORRECTION

PATENT NO. : 9,139,933 B2  
APPLICATION NO. : 13/187904  
DATED : September 22, 2015  
INVENTOR(S) : Tsumori et al.

It is certified that error appears in the above-identified patent and that said Letters Patent is hereby corrected as shown below:

In the claims

Claim 10, column 18, line 61, change "ClF3" to --$ClF_3$--.

Signed and Sealed this
Eighth Day of March, 2016

Michelle K. Lee
*Director of the United States Patent and Trademark Office*